US006929820B2

(12) United States Patent
Shimakage et al.

(10) Patent No.: US 6,929,820 B2
(45) Date of Patent: Aug. 16, 2005

(54) METHOD OF FORMING A SUPERCONDUCTOR FILM

(75) Inventors: Hisashi Shimakage, Tokyo (JP); Atsushi Saito, Tokyo (JP); Akira Kawakami, Tokyo (JP); Zhen Wang, Tokyo (JP)

(73) Assignee: National Institute of Information and Communications Technology, Tokyo (JP)

( * ) Notice: Subject to any disclaimer, the term of this patent is extended or adjusted under 35 U.S.C. 154(b) by 54 days.

(21) Appl. No.: 10/237,125

(22) Filed: Sep. 9, 2002

(65) Prior Publication Data

US 2003/0130130 A1 Jul. 10, 2003

(30) Foreign Application Priority Data

Nov. 22, 2001 (JP) ........................................ 2001-356803

(51) Int. Cl.[7] .......................... B05D 5/12; H01L 39/24; C23C 14/32
(52) U.S. Cl. ......................... 427/62; 29/599; 427/561; 427/593; 505/470; 505/473; 204/192.24
(58) Field of Search .......................... 427/62, 561, 566, 427/593; 505/470, 473, 474, 951 B; 204/192.1, 192.15, 192.24; 29/599

(56) References Cited

U.S. PATENT DOCUMENTS 4,950,642 A * 8/1990 Okamoto et al. ........... 505/477
5,039,657 A * 8/1991 Goldman et al. ........... 505/330
5,089,104 A * 2/1992 Kanda et al. ........... 204/192.11

OTHER PUBLICATIONS

Atsushi Saito, et al., "As–Grown Deposition of Superconducting MgB$_2$ Thin Films by Multiple–Target Sputtering System", (1) Jpn.J.Appl.Phys.Vol.41 (2002)pp. L127–129 Part 2, No. 2A, Feb. 1, 2002.

Atsushi Saito, et al., "Fabrication of Josephson Junctions As–Grown MgB$_2$ Thin Films," The Japan Society of Applied Physics, No. 49, Mar., 2002, Abstract 28a–ZB–3.

Atsushi Saito, et al., "As–Grown Deposition of MgB$_2$ Thin Films and Fabrication of Josephson Junctions", The Institute of Electrons, Information and Communication Engineers, Technical Report of IEICE.SCE2002–2,MW2002–2 (Apr. 2002).

Atsushi Saito, et al., "As–Grown MgB$_2$ Thin Films Deposited On Al$_2$O$_3$ Substrates With Different Crystal Plane," International Conference on Electronics Materials, Jun. 12, 2002, Abstract.

Atsushi Saito, et al., "As–Grown MgB$_2$ Thin Film Deposited On Al$_2$O$_3$ Substrates With Different Crystal Plane," Super Conductor Science and Technology 15 (2002) 1–5, Received Jun. 24, 2002.

Atsushi Saito, et al., "Fabrication of Josephson Junctions As–Grown MgB$_2$ Thin Films," Applied Superconductivity Conference Aug. 8, 2002 Abstract (4EG11).

Hisashi Shimakage, et al., "Low Temperature Fabrication of As–Grown MgB$_2$ Thin Films by Carrousel–Type Sputtering Apparatus", The Japan Society of Applied Physic, No. 62, Sep. 12, 2001, Abstract 12p–M–10.

(Continued)

Primary Examiner—Brian K. Talbot

(57) ABSTRACT

A method includes forming an as-grown film of a superconductor composed of a MgB$_2$ compound which is made by simultaneous evaporation of magnesium and boron. The as-grown film is superconductive without an annealing process to make the film superconductive. The method can be applied to fabricate an integrated circuit of the superconductor film, because a high temperature annealing process to make the as-grown film superconductive is not needed.

8 Claims, 5 Drawing Sheets

OTHER PUBLICATIONS

Atsushi Saito, et al. "Fabrication of Josephson junctions as–grown MgB$_2$ thin films." *The Japan Society of Applied Physic*, No. 49, Mar. 2002 abstract 28a–ZB3.

Hisashi Shimakage, et al., "Low Temperature Fabrication of As–Grown MgB$_2$ Thin Films by Carrousel–Type Sputtering Apparatus", The Japan Society of Applied Physic, No. 62, Sep. 12, 2001, Abstract 12p–M–10.

Jun Nagamatsu, et al. "Superconductivity at 39 K in magnesium diboride", *Nature*, Mar. 1, 2001, pp. 63 and 64.

Dave H.A. Blank et al. "Superconducting Mg–B films by pulsed–laser deposition in an in situ two–step process using multicomponent targets", *Applied Phsyics Letters*, vol. 79, No. 3, Jul. 16, 2001, pp. 394–396.

S.R. Shinde et al. "Superconducting MgB$_2$ thin films by pulsed laser deposition", *Applied Physics Letter*, vol. 79, No. 2, Jul. 9, 2001; pp. 227–229.

* cited by examiner

METHOD OF FORMING A SUPERCONDUCTOR FILM

CROSS REFERENCE TO RELATED APPLICATIONS

This application claims priority to Japanese Patent Application No. 2001-356803, filed Nov. 22, 2001 in Japan, the contents of which are incorporated herein by reference.

BACKGROUND OF THE INVENTION

1. Field of the Invention

The present invention relates to a method of forming a superconductor film. More specifically, the present invention relates to method of forming a superconductor film of a compound of magnesium and boron formed on a substrate by vacuum evaporation of magnesium and boron.

2. Description of the Related Art

A $MgB_2$ compound features one of high transition temperature of any superconductor. It is reported that the coherent length $\xi(0)=54$ Å, magnetic penetration depth of $MgB_2$ is 140–180 nm. A thin film of $MgB_2$ can be integrated on a substrate to form an integrated circuit of a superconductor film of $MgB_2$ at a high temperature. Thus the $MgB_2$ film compound is expected to apply to electronics devices such as thin film devices.

One well known method of making the superconductor of $MgB_2$ is to form a bulk of $MgB_2$ by compression molding of powder of single crystals of $MgB_2$ and then annealing the bulk at a high temperature. Another method of forming the superconductor of $MgB_2$ is to form a thin film of a $MgB_2$ compound by using PLD (pulse laser deposition), and then annealing the thin film of $MgB_2$ in the temperature range of 600° C.–1200° C. to make the film superconductive. The PLD method focuses a pulsed laser beam on a boron target to evaporate boron atoms on a substrate. The boron atoms on the substrate are exposed to high temperature magnesium vapor in a reaction room to form the $MgB_2$ film on the substrate. Further the film is annealed at a high temperature so as to be superconductive. Another method of forming the superconductor film of a $MgB_2$ compound by using the PLD is as follows.

Magnesium atoms and boron atoms are deposited on a substrate by the PLD method. Moreover the atoms of magnesium and boron on the substrate are exposed to vapor of magnesium in the reaction room. The magnesium and boron on the substrate react in the magnesium vapor to form a thin film of the $MgB_2$ compound on the substrate. Annealing the $MgB_2$ film at a high temperature enables the film to have features of a superconductor.

All prior art regarding fabrication of the superconductor of the $MgB_2$ compound requires high temperature annealing in the range of 600° C.–1200° C. The necessity of the annealing process of the $MgB_2$ film to produce features of a superconductor makes fabrication of a device such as a thin film integrated circuit on a substrate difficult. Further, an as-grown film of $MgB_2$ on a substrate by vacuum evaporation of magnesium and boron having characteristics of a superconductor without being annealed has not been realized at the present time.

SUMMARY OF THE INVENTION

An aspect of the present invention is to provide a method of forming an as-grown film of superconductor composed of the $MgB_2$ compound. The as-grown film of the superconductor has features of a superconductor without being annealed.

The present invention provides the method of forming an as-grown thin film of a superconductor composed of the $MgB_2$ compound made by simultaneous evaporation of magnesium and boron. The as-grown film composed of the compound of magnesium and boron is a superconductor without being annealed. The as-grown film can be composed of a $MgB_2$ compound, or the film can be composed of one or plural compounds of magnesium and boron different from the $MgB_2$ compound, a magnesium element and a boron element in addition to the $MgB_2$ compound.

As mentioned above, an as-grown film of a superconductor film of $MgB_2$ made by the present invention has features of a superconductor without being annealed. Thus, the present invention can be applied to fabricate an integrated circuit of the superconductor thin film, because the high temperature annealing process to make the film superconductive is not required.

The aspects, advantages and features of the present invention will be more clearly understood by referencing the following detailed disclosure and the accompanying drawings.

DETAILED DESCRIPTION OF THE PREFERRED EMBODIMENTS

Figure 1:
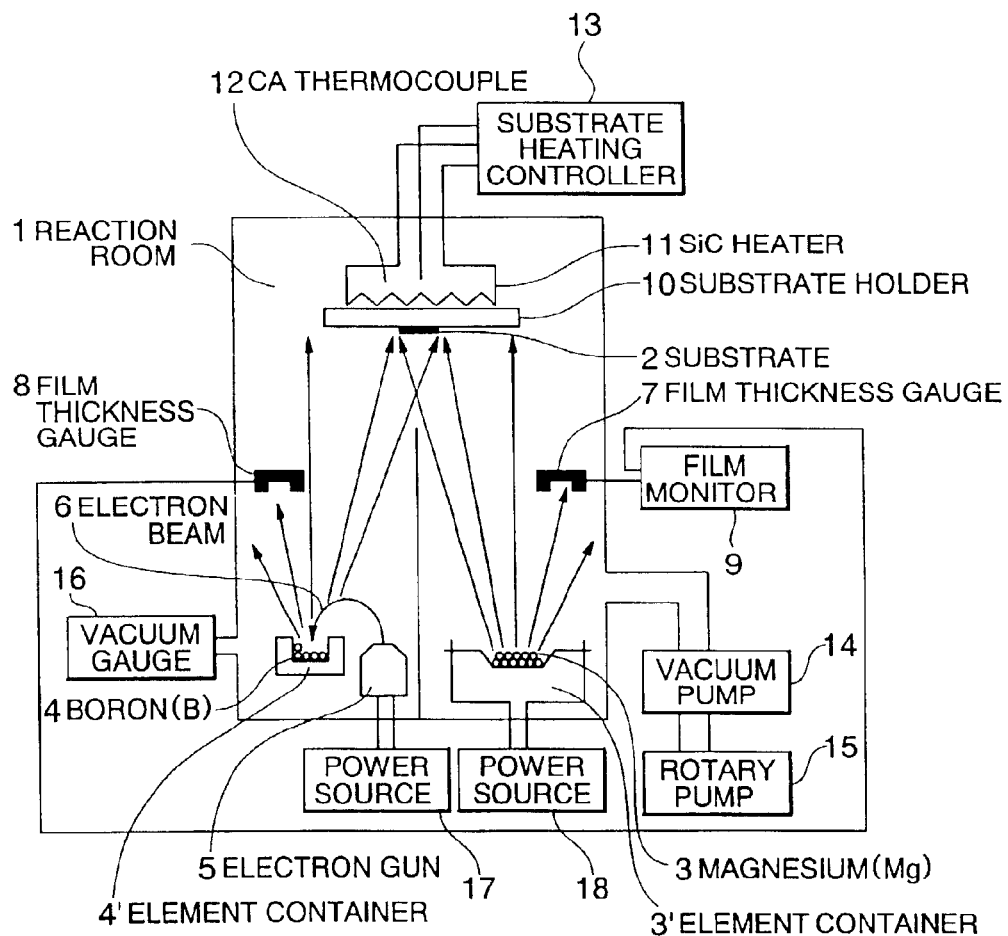
FIG. 1 shows an embodiment of an apparatus of vacuum evaporation for implementing the present invention.

FIG. 1 shows an apparatus of vacuum evaporation for implementing the present invention. An as-grown film of a compound of magnesium and boron is formed by simultaneous evaporation of magnesium and boron using the apparatus. The apparatus is composed of a reaction room 1, element containers 3' and 4', an electron gun 5, film thickness gauges 7 and 8, a film monitor 9, vacuum pumps 14, a rotary pump 15, a vacuum gauge 16, a power source 17 of the electric gun, a power source 18 of the element holder 3', a substrate holder 10, SiC heater 11, a CA thermocouple 12, and a substrate heating controller 13.

The film forming method of the $MgB_2$ compound using the vacuum evaporator shown in FIG. 1 will be explained. Boron 4 and magnesium 3 are put respectively in the container 4' and the container 3'. A substrate 2 is held on the substrate holder 10. The material of the substrate 2 is, for example, $Al_2O_3$, $MgO$, $SiO_2$ etc. The reaction room is exhausted into vacuum by the vacuum pump 14 and the rotary pump 15. Electron beams generated by the electric gun 5 are curved by magnetic field (magnet is not shown) and the surface of the boron 4 is irradiated with the electron beams to heat it.

The boron heated by the irradiation of electron beams evaporates into vapor. The container 3' containing the magnesium 3 is heated by the power source 18 to evaporate the magnesium 3. The substrate 2 is heated by the SiC heater 11.

The temperature of the substrate 2 is controlled to a temperature range of 100° C.–350° C. with the substrate heating controller 13. The boron vapor originated from the boron 4 is deposited on the substrate 2. The thickness of the boron film is measured with the film thickness gauge 8 and monitored with the film thickness monitor 9. The magnesium vapor originated from the magnesium 3 is deposited on the substrate 2. The thickness of the film of the magnesium is measured with the film thickness gauge 7 and monitored with the film thickness monitor 9.

The magnesium and boron deposited simultaneously on the substrate 2 is reacted chemically on the substrate 2 to produce the compound of magnesium and boron. Moreover, the vapor of the magnesium and boron reacts in the reaction room 1 to produce the compound of magnesium and born. Molecules of the compound of the magnesium and boron are deposited on the substrate 2.

The as-grown film is usually polycrystalline, amorphous or single crystal, and has features in a superconductor without being annealed. The as-grown film can be composed of a $MgB_2$ compound, or the film can be composed of one or plural of compounds of magnesium and boron different from the $MgB_2$ compound, a magnesium element and a boron element in addition to the $MgB_2$ compound Polycrystal or amorphous as-grown films as follow are explained. In the explanation in the following, the temperatures of the substrates are measured with the thermocouple. Thus the real temperatures of the substrates may be a little more than those measured.

In the embodiment as follows, the substrates temperatures are in a temperature range of 100° C.–350° C., the film forming rate of boron is 0.5–1.5 Å/sec, the film forming rate of magnesium is about 5 Å/sec, and the film forming pressure is about $10^{-6}$ Torr, which is a degree of vacuum in the reaction room. An as-grown film of $MgB_2$ is formed on a substrate with the above condition.

Figure 2A:
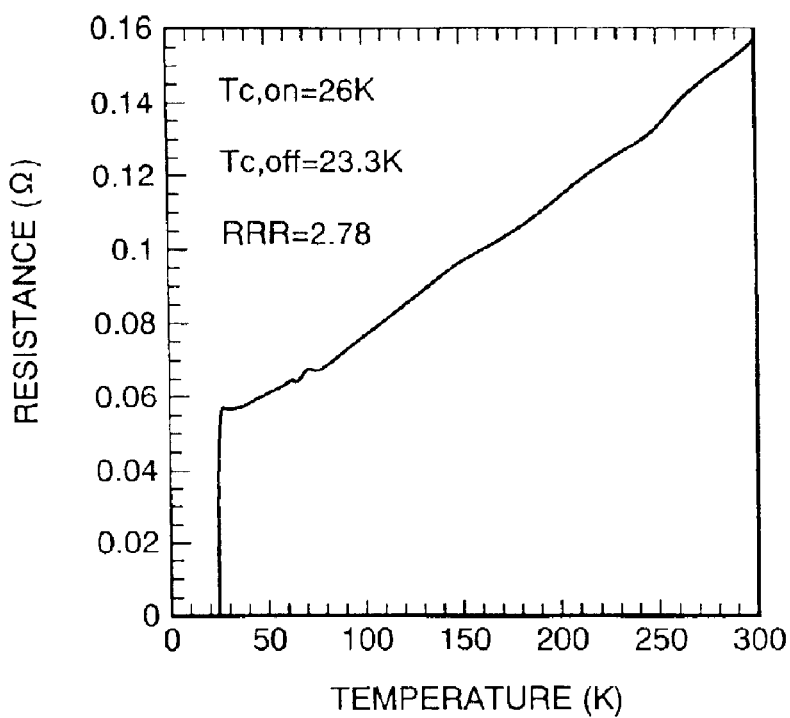
FIG. 2A shows temperature-resistance characteristics of a $MgB_2$ compound of an example 1 made with the method of the present invention.
Figure 2B:
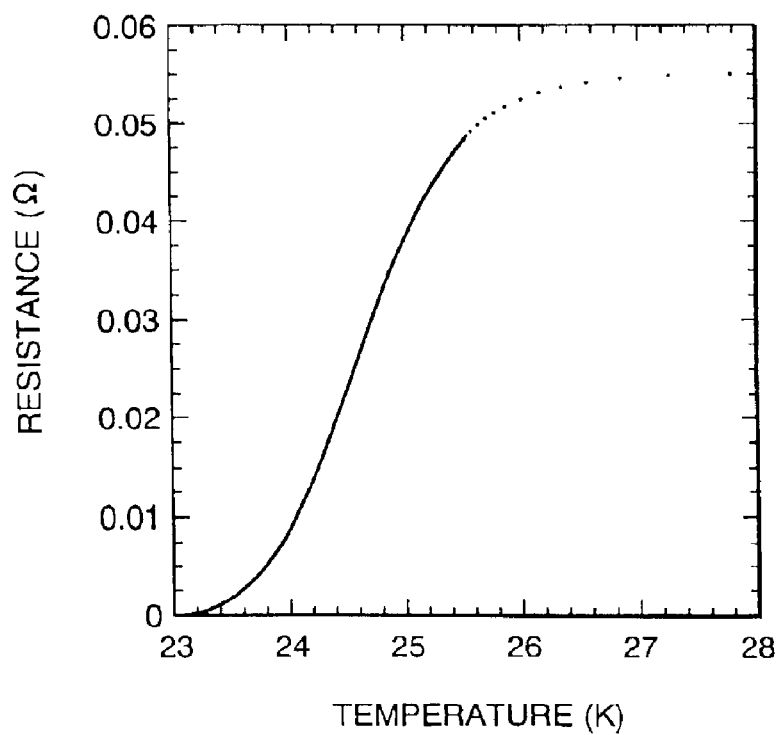
FIG. 2B shows temperature-resistance characteristics in the temperature range of 23K–28K in FIG. 2A.

FIG. 2A and 2B show resistance—temperature characteristics of $MgB_2$ film of an example 1 made by the present invention. The axis of abscissas in FIG. 2B is enlarged and corresponds to the region of 23K–28K on the axis of abscissas in FIG. 2A. The as-grown film of $MgB_2$ is formed on a substrate using the vacuum evaporation apparatus shown in FIG. 1. The substrate temperature is at a temperature of 200° C., and the film forming rate of magnesium is 5 Å/sec, the film forming rate of boron is 0.5 Å/sec. The film forming pressure is about $10^{-6}$ Torr. The temperature-resistance characteristics are those of the as-grown film without being annealed.

Moreover as the critical temperature and Residual Resistance Ratio (RRR), the critical temperature Tc on of 26K,Tc off of 23.3K and RRR of 2.78 are measured. The Tc on and Tc off show Tc of onset and Tc of offset respectively. Residual Resistance Ratio is a ratio of resistance at 300K to resistance at 40K. It shows a film quality. The greater the RRR of the film is the nearer to a perfect single crystal, the less the specific resistance, and the nearer to metal.

FIG. 2A and 2B show that an as-grown film of superconductor of its critical temperature Tc of about 25K can be formed by the simultaneous evaporation of magnesium and boron, and it has features of the superconductor without being annealed.

Figure 3:
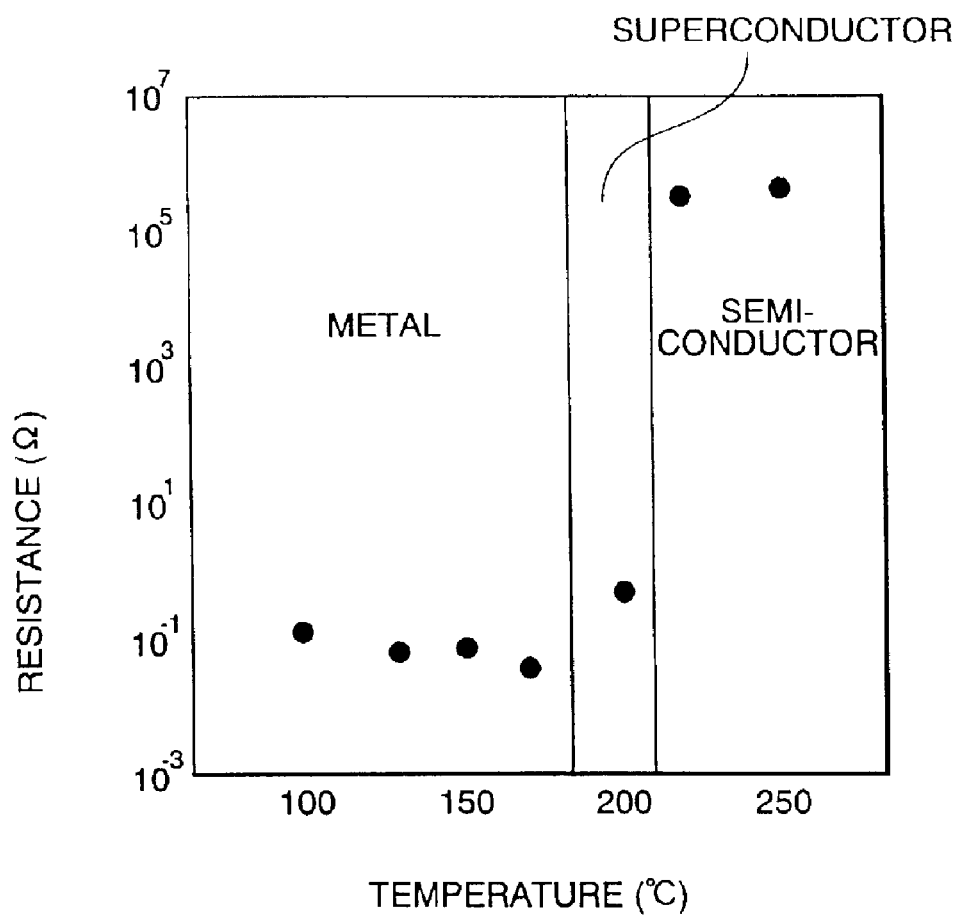
FIG. 3 shows the relation of temperature-resistance characteristics of the film to substrate temperature.

FIG. 3 shows the relation of resistance characteristics to substrate temperature, that is, the substrate temperatures dependence of resistance of films made on various substrate temperatures by the present invention. The film forming rate of magnesium is 5 Å/sec, the film forming rate of boron is 0.5 Å/sec, the substrate temperature is in a temperature of 100° C.–250° C. The films formed on a substrate of temperature lower than about 180° C. are metallic, and the films formed on a substrate of temperature higher than about 210° C. are semiconductor. Moreover, the films formed on a substrate of temperature between 190–210° C. are superconductive.

Figure 4:
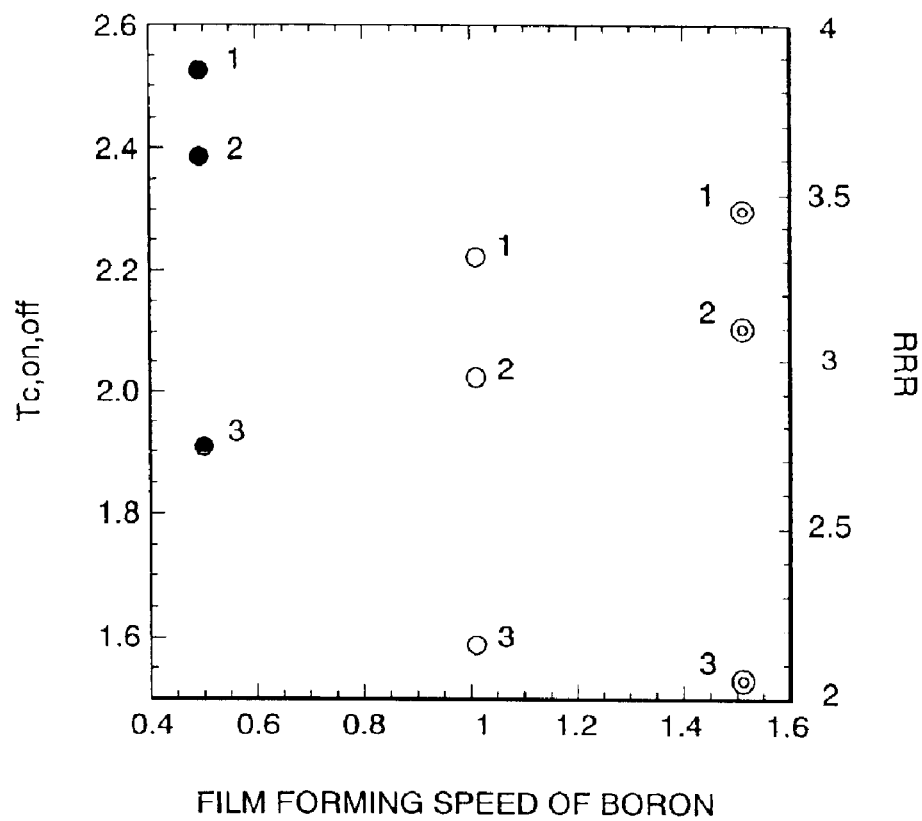
FIG. 4 shows the critical temperature and residual-resistance ratio to film forming speed.

FIG. 4 shows the critical temperature and Residual Resistance Ration characteristic of films made by the present invention to the boron film forming speed. The substrate temperature is 200° and the magnesium film forming rate is 5 Å/sec for all data. Black dots show the boron film forming rate of 0.5 Å/sec, single circles show the boron film forming rate of 1.0 Å/sec, and double circles show the boron film forming rate of 1.5 Å/sec. In the FIG. 5, number 1 corresponding to each mark shows characteristics of Tc on, number 2 corresponding to each mark shows characteristics of Tc off and number 3 corresponding to each mark shows RRR characteristics.

In the case of film forming rate of 0.5 Å/sec, the critical temperature and RRR of the $MgB_2$ film are about 25K and 2.7 respectively. In the case of a film forming rate of 1.0 Å/sec, critical temperature and RRR of $MgB_2$ film are about 21K and 2.15 respectively. In the case of film forming rate of 1.5 Å/sec, critical temperature and RRR of $MgB_2$ film are about 22K and 2.05 respectively. The film of the film forming rate of 0.5 Å/sec is the best of the other two films of $MgB_2$ shown in FIG. 4 because the critical temperature is highest and RRR is greatest in the films.

The composition ratio of boron and magnesium in the $MgB_2$ compound films of film forming rate of 0.5 Å/sec in FIG. 4 is measured with WDS (composition ratio analyzing with irradiation of electron beam). The measured composition ratio of boron and magnesium is B:Mg=2:2.74. The ideal composition ratio of boron and magnesium is B:Mg= 2:1. So the $MgB_2$ films of the example 1 are magnesium rich films. Considering that magnesium is vaporized easily, the film forming rate of boron and magnesium to form the composition ratio of boron and magnesium of B:Mg=1: about 10 is desired. However as-grown film of $MgB_2$ having features of a superconductor without being annealed can be formed with the film forming rate other than the above mentioned film forming rate.

Figure 5:
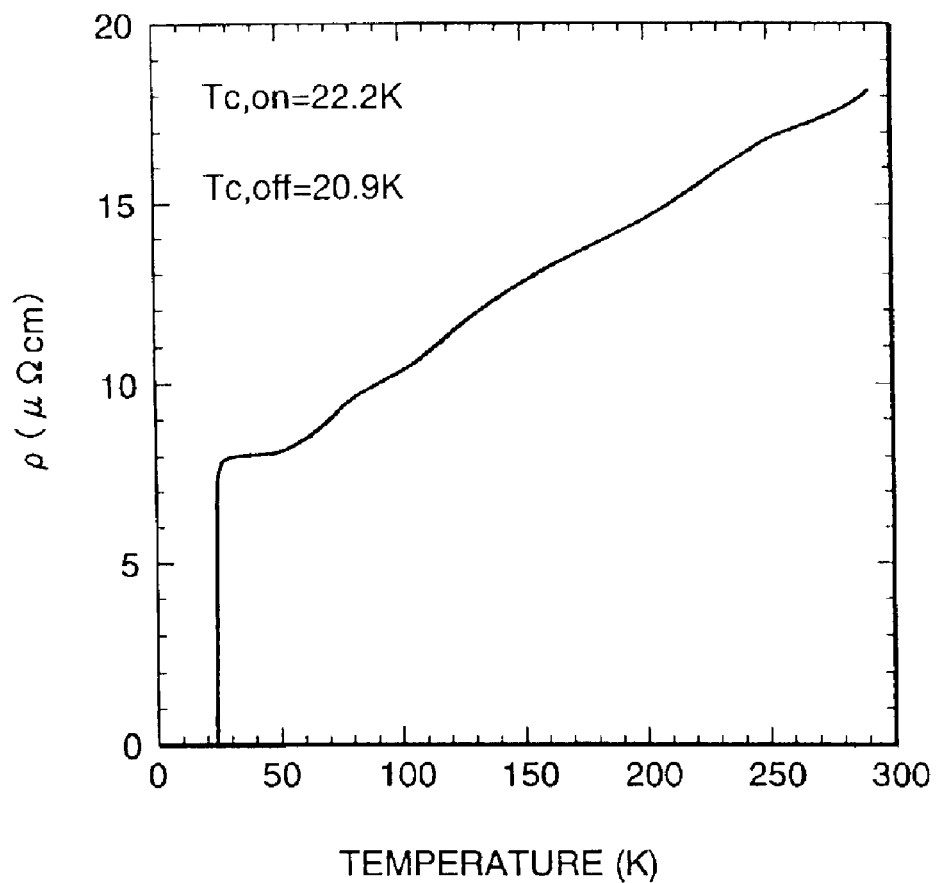
FIG. 5 shows temperature-resistance characteristics of $MgB_2$ of example 2 made by the present invention.

FIG. 5 shows resistance—temperature characteristics of $MgB_2$ film of example 2 made by the present invention. The as-grown film of $MgB_2$ is formed on a substrate using the vacuum evaporation apparatus shown in FIG. 1. The film forming rate is different from those of the example 1 shown in FIGS. 2A and 2B. The substrate temperature is at a temperature of 200° C., and the film forming rate of magnesium is 5 Å/sec, the film forming rate of boron is 1.0 Å/sec. The temperature-resistance characteristics are those of the as-grown film without being annealed. Critical temperature Tc and specific resistance $\rho$ of the film shown in FIG. 5 are about 21K and 8.0 $\mu\Omega$cm (at 30K) respectively. A superconductor film of $MgB_2$ can be formed with the film forming rate of the example 2 of the present invention.

The films formed by the present invention explained above are polycrystalline or amorphous. However a superconductor of an as-grown film of single crystal can be made without being annealed by the simultaneous evaporation of magnesium and boron using the apparatus shown in FIG. 1. The single crystal film of $MgB_2$ is in a scope of the present invention.

The many features and advantages of the present invention are apparent from the detailed specification and, thus, it is intended by the appended claims to cover all such features and advantages of the invention which fall within the true spirit and scope of the invention. Further, since numerous modification and changes will readily occur to those skilled in the art, it is not desired to limit the invention to the exact construction and operation illustrated and described, and accordingly all suitable modification and equivalents falling within the scope of the invention may be included in the present invention.

What is claimed is:

1. Method of forming a superconductor film comprising:
    setting magnesium and boron as evaporation sources;
    setting a substrate facing to the magnesium and the boron, wherein the temperature of the substrate is controlled to a temperature range of 100° C.–350° C.;
    heating the magnesium and boron to evaporate them; and
    forming a film of a compound of magnesium and boron on the substrate with simultaneous evaporation of magnesium and boron;
    wherein the film has features of a superconductor without being annealed, and the growing rate of magnesium is at least twice the growing rate of boron.

2. Method of forming a superconductor film in claim 1:
    wherein the film further comprises a compound of magnesium and boron different from the compound of magnesium and boron.

3. Method of forming a superconductor film in claim 1:
    wherein the film is polycrystalline, single crystalline or amorphous.

4. Method of forming a superconductor film in claim 1:
    wherein the substrate temperature is in a range of temperature of 100° C.–350° C., a film forming rate of magnesium is about 5 Å/sec, a film forming rate of boron is about 0.5–1.5 Å/sec and the film is an as-grown film of the compound of magnesium and boron.

5. Method of forming a superconductor film in claim 1:
    wherein the critical temperature is in a range of 21K–25K.

6. Method of forming a superconductor film in claim 2:
    wherein the film is polycrystalline, single crystalline or amorphous.

7. Method of forming a superconductor film in claim 2:
    wherein the substrate temperature is in a range of temperature of 100° C.–350° C., a film forming rate of magnesium is about 5 Å/sec, a film forming rate of boron is about 0.5–1.5 Å/sec and the film is an as-grown film of the compound of magnesium and boron.

8. Method of forming a superconductor film in claim 2:
    wherein the critical temperature is in a range of 21K–25K.

* * * * *

UNITED STATES PATENT AND TRADEMARK OFFICE
CERTIFICATE OF CORRECTION

PATENT NO. : 6,929,820 B2
APPLICATION NO. : 10/237125
DATED : August 16, 2005
INVENTOR(S) : Hisashi Shimakage et al.

It is certified that error appears in the above-identified patent and that said Letters Patent is hereby corrected as shown below:

Title Page, Column 2 (Other Publications), Line 8, delete "Electrons" and insert -- Electronics -- therefor.
Title Page, Column 2 (Other Publications), Line 21, after "Conference" insert -- , --.
Title Page, Column 2 (Other Publications), Line 21, after "2002" insert -- , --.
Title Page, Column 2 (Other Publications), Line 24, delete "Physic" and insert -- Physics -- therefor.
Column 5, line 22, (claim 1, line 11) change "the growing rate of magnesium is at least twice the growing rate of boron" to --a film forming rate of magnesium is about 5 Å/sec, a film forming rate of boron is about 0.5-1.5 Å/sec and the film is an as-grown film of the compound of magnesium and boron--.
Column 6, line 4, delete "claim 4".

Signed and Sealed this

Twenty-ninth Day of May, 2007

JON W. DUDAS
*Director of the United States Patent and Trademark Office*